United States Patent
Lin et al.

(10) Patent No.: US 9,000,584 B2
(45) Date of Patent: Apr. 7, 2015

(54) PACKAGED SEMICONDUCTOR DEVICE WITH A MOLDING COMPOUND AND A METHOD OF FORMING THE SAME

(75) Inventors: Jing-Cheng Lin, Hsinchu County (TW); Jui-Pin Hung, Hsinchu (TW); Nai-Wei Liu, Fengshan (TW); Yi-Chao Mao, Zhongli (TW); Wan-Ting Shih, Touwu Township (TW); Tsan-Hua Tung, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 156 days.

(21) Appl. No.: 13/338,820

(22) Filed: Dec. 28, 2011

(65) Prior Publication Data

US 2013/0168848 A1    Jul. 4, 2013

(51) Int. Cl.
| | |
|---|---|
| *H01L 23/498* | (2006.01) |
| *H01L 23/31* | (2006.01) |
| *H01L 23/00* | (2006.01) |
| *H01L 21/56* | (2006.01) |

(52) U.S. Cl.
CPC .......... *H01L 23/3114* (2013.01); *H01L 21/561* (2013.01); *H01L 21/568* (2013.01); *H01L 23/3128* (2013.01); *H01L 24/19* (2013.01); *H01L 24/20* (2013.01); *H01L 2224/04105* (2013.01)

(58) Field of Classification Search
USPC ......................................... 257/738, 773–794
See application file for complete search history.

(56) References Cited

U.S. PATENT DOCUMENTS

| | | | |
|---|---|---|---|
| 7,462,511 | B2 | 12/2008 | Yamagata |
| 8,456,018 | B2 * | 6/2013 | Park et al. ...................... 257/774 |
| 2009/0278263 | A1 * | 11/2009 | Mccarthy et al. .............. 257/778 |
| 2009/0321918 | A1 * | 12/2009 | Lin et al. ....................... 257/690 |
| 2010/0213608 | A1 * | 8/2010 | Lau et al. ....................... 257/737 |
| 2012/0119379 | A1 * | 5/2012 | Koizumi et al. ............... 257/774 |

FOREIGN PATENT DOCUMENTS

| | | |
|---|---|---|
| DE | 11 2007 002 587 | 9/2009 |
| WO | 2008/057837 | 5/2008 |

OTHER PUBLICATIONS

Office Action with English Translation dated Jul. 17, 2013 from corresponding application No. DE 10 2012 109 484.5.

* cited by examiner

*Primary Examiner* — Thanh Nguyen
(74) *Attorney, Agent, or Firm* — Lowe Hauptman & Ham, LLP (57) ABSTRACT

The mechanisms of forming a molding compound on a semiconductor device substrate to enable fan-out structures in wafer-level packaging (WLP) are provided. The mechanisms involve covering portions of surfaces of an insulating layer surrounding a contact pad. The mechanisms improve reliability of the package and process control of the packaging process. The mechanisms also reduce the risk of interfacial delamination, and excessive outgassing of the insulating layer during subsequent processing. The mechanisms further improve planarization end-point. By utilizing a protective layer between the contact pad and the insulating layer, copper out-diffusion can be reduced and the adhesion between the contact pad and the insulating layer may also be improved.

20 Claims, 11 Drawing Sheets

PACKAGED SEMICONDUCTOR DEVICE WITH A MOLDING COMPOUND AND A METHOD OF FORMING THE SAME

CROSS-REFERENCE TO RELATED APPLICATIONS

This application relates to the following co-pending and commonly assigned patent application: Ser. No. 13/228,244, entitled "Packaging Methods and Structures Using a Die Attach Film" and filed on Sep. 8, 2011, which is incorporated herein in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Thus, new packaging technologies, such as wafer level packaging (WLP), have begun to be developed, in which integrated circuits (ICs) are placed on a carrier having wiring for making connection to the ICs and other electrical components. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1I is an enlarged, cross-sectional view of a packaged semiconductor device of FIG. 1H, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are illustrative of specific ways to make and use the disclosure, and do not limit the scope of the disclosure.

Figure 1A:
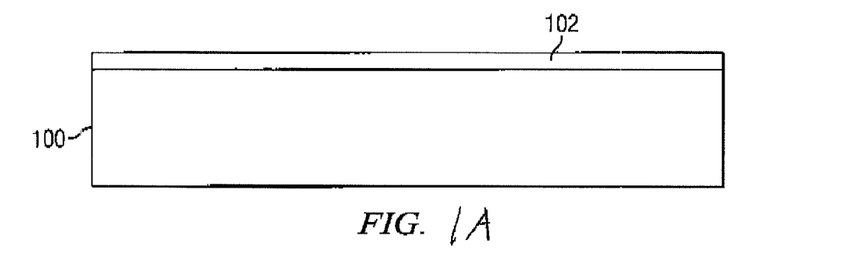
FIGS. 1A through 1H are cross-sectional views of a semiconductor device in a fan-out wafer level package (FO-WLP) at various packaging stages in accordance with some embodiments.

FIGS. 1A through 1I are cross-sectional views of a semiconductor device at various packaging stages in accordance with an embodiment of the present disclosure. Referring first to FIG. 1A, a carrier wafer 100 is provided. The carrier wafer 100 may comprise glass, silicon oxide, aluminum oxide, and the like, as examples. The carrier wafer 100 thickness may be between about a few mils to several tens of mils and may comprise a diameter of about 300 mm in some embodiments. The carrier wafer 100 functions as a carrier wafer for fan-out, which means electrical connection beyond the boundary of a semiconductor die, processing during the packaging of semiconductor devices or dies 104 (see FIG. 1B).

In some embodiments, a die attach film (DAF) 102 is formed over the carrier wafer 100, as shown in FIG. 1A. The DAF 102 may comprise a polymer and in some embodiments comprises a thermoplastic material. The DAF 102 may be liquid, e.g., a thick liquid, when applied but forms a solid at room temperature, and may become semi-liquid when heated and may become sticky to function as an adhesive at elevated temperatures.

Figure 1B:
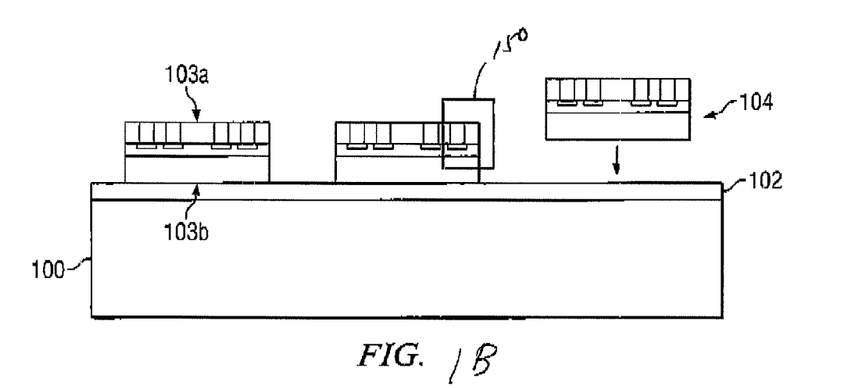

Next, a plurality of dies 104 is attached to the DAF 102, as shown in FIG. 1B. Several dozens of dies 104 or several hundreds of dies 104 or more may be attached to the DAF 102, depending on the size of the dies 104, the size of carrier wafer 100, and the particular application, as examples. The dies 104 have a front side 103a and a back side 103b for purposes of discussion herein. The front side 103a of the dies 104 is also referred to herein as a first side, and the back side 103b is also referred to herein as a second side. The dies 104 comprise semiconductor devices or integrated circuits that have been previously manufactured on a semiconductive substrate. The dies 104 may comprise one or more layers of electrical circuitry and/or electronic functions formed thereon, and may include conductive lines, vias, capacitors, diodes, transistors, resistors, inductors, and/or other electrical components, for example (not shown). The dies 104 have been singulated from each other after manufacture and are ready for packaging. A pick and place machine may be used to place the dies 104 in predetermined locations on the carrier wafer 100, for example. The back sides 103b of the dies 104 are attached to the DAF 102, as shown in FIG. 1B.

Figure 1C:
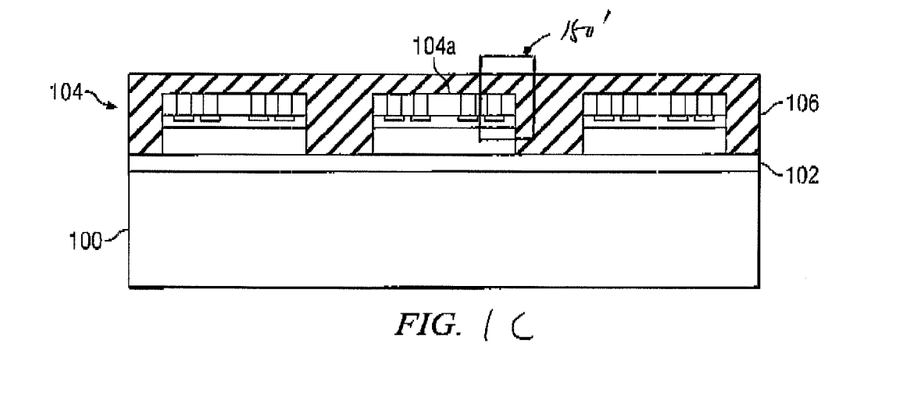
Figure 1D:
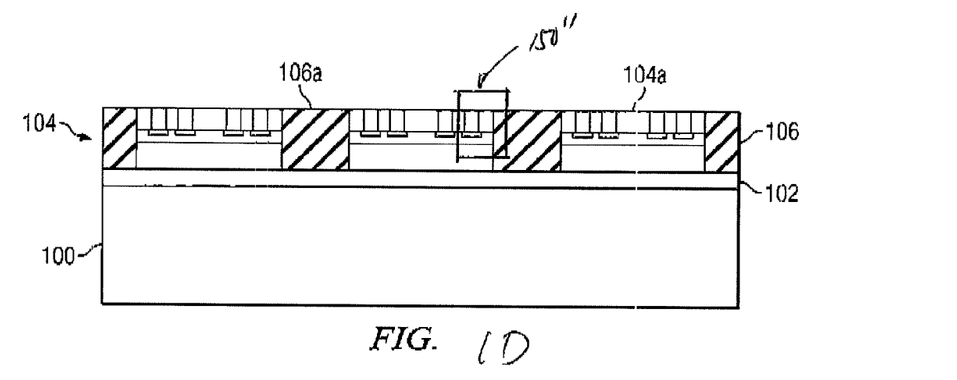

Next, a packaging process is performed to package each of the plurality of dies 104. In some embodiments as depicted FIGS. 1A through 1I, to package the dies 104, first, a molding compound 106 is formed over the plurality of dies 104 and over exposed portions of the DAF 102, as shown in FIG. 1C. The molding compound 106 may be molded onto the dies 104 and DAF 102 over the carrier wafer 100, as shown. The top surface of molding compound 106 may be higher than (as shown in FIG. 1C), level with (as shown in FIG. 1D), or slightly lower than, top surfaces 104a of the dies 104. The molding compound 106 fills into the gaps between the plurality of dies 104, as shown. More details of the molding formation process will be described below.

Next, a planarizing process, such as a grinding process, may be performed to planarize the top surfaces 104a of the plurality of dies 104, so that any unevenness in the top surfaces 104a of the dies 104 may be at least reduced, and possibly substantially eliminated. If the molding compound 106 comprises portions on the top surfaces 104a of the dies 104, these portions of molding compound 106 are also removed by the grinding process, as shown in FIG. 1D. Accordingly, the top surfaces 106a of the remaining portions of the molding compound 106 are level with top surfaces 104a of the plurality of dies 104. Furthermore, the height or thickness of the plurality of dies 104 may also be reduced to a predetermined height through the grinding process.

A wiring layer 108 is formed over the top surfaces 104a of the plurality of dies 104, e.g., on the front sides 103a of the dies 104, as shown in FIG. 5. The wiring layer 108 may comprise one or more redistribution layers (RDLs), to be described further herein with respect to FIG. 1I. The RDL layer(s) is surrounded by one or more dielectric layers. Portions of the RDL(s) may extend beyond the boundaries of dies 104. As a result, greater connectivity and design flexibility can be achieved. The RDL(s) enable fan-out design for wafer level packaging (WLP).

Figure 1E:
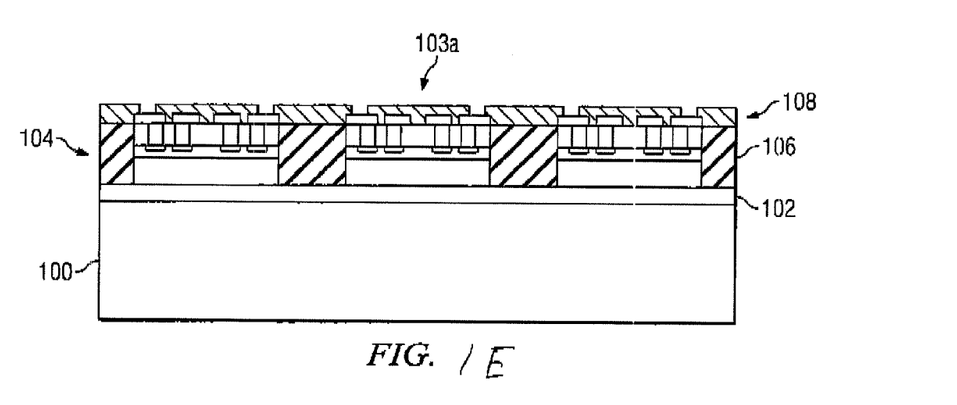
Figure 1F:
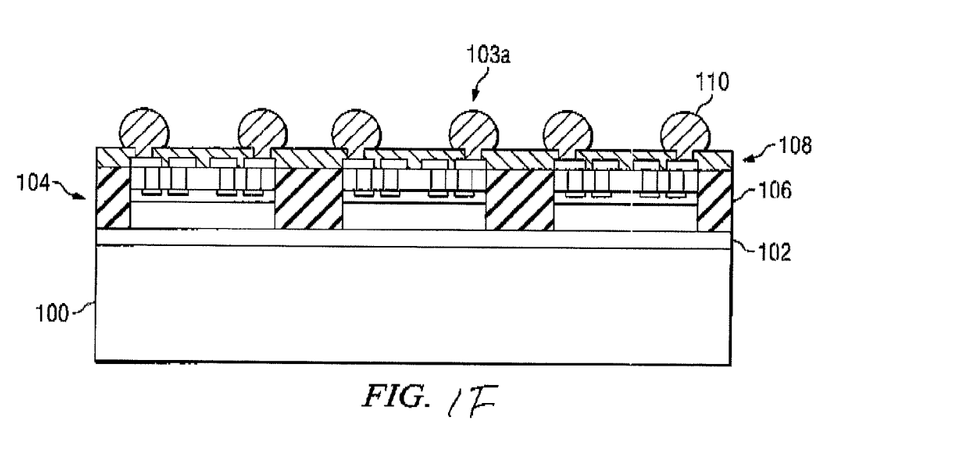

The structure shown in Figure 1E comprises a reconstructed wafer over the carrier wafer 100 that includes the plurality of dies 104, for example. A plurality of solder balls 110 is formed over portions of the wiring layer 108, as shown in FIG. 1F. The packaged dies 104 may optionally be tested, e.g., by performing electrical and functional tests at this stage of the manufacturing and packaging process.

The packaged dies 104 comprise the molding compound 106, wiring layer 108, solder balls 110, and also the DAF 102 in some embodiments. In other embodiments, the DAF 102 is removed, and the packaged dies comprise the molding compound 106, wiring layer 108, and solder balls 110.

Figure 1G:
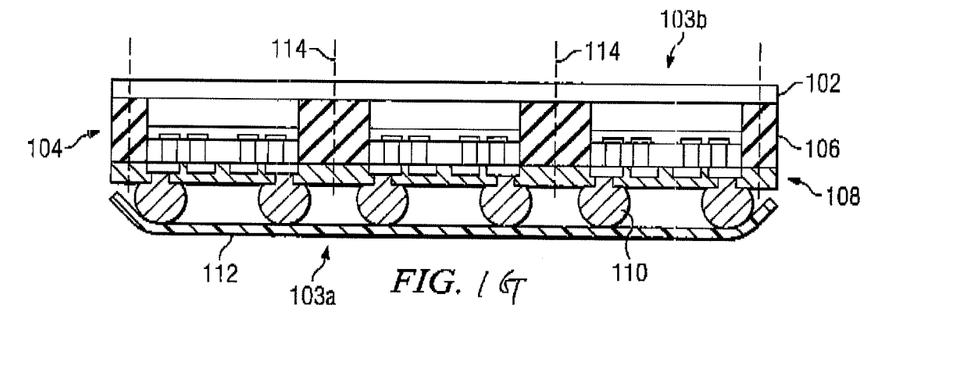

Next, at least the carrier wafer 100 is removed from the packaged dies 104, as shown in FIG. 1G, in accordance with some embodiments. The molding compound 106 and wiring layer 108 support the dies 104 during the debonding process of the carrier wafer 100 from the packaged dies 104, for example. In the embodiment shown in FIGS. 1A through 1I, the DAF 102 is left remaining on the back sides 103b of the dies 104, as shown. Alternatively, the DAF 102 may be removed when the carrier wafer 100 is removed or in a separate processing step, e.g., using a light (laser) or a thermal process.

Figure 1H:
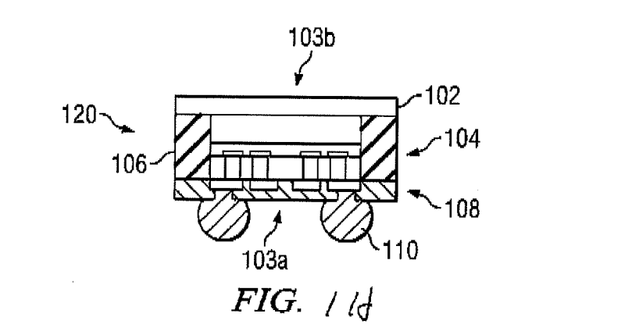

The packaged dies 104 are then singulated or separated at singulation lines 114, forming individual packaged dies 104, also referred to herein as packaged semiconductor devices 120, as shown in FIG. 1H. The molding compound 106 is disposed between the wiring layer 108 and the DAF 102 proximate edges of the die 104 within the packaged semiconductor device 120, which protects the edges of the die 104. To singulate the packaged dies 104 from adjacent packaged dies 104, tape 112 may be applied to the solder balls 110 on the front sides 103a of the dies 104, also shown in FIG. 1G. The tape 112 comprises dicing tape that supports the packaged dies 104 during the singulation process. The packaged semiconductor devices 120 are then removed from the tape 112, shown in FIG. 1H.

FIG. 1I is an enlarged, cross-sectional view of the packaged semiconductor device 120 shown in FIG. 1H, in accordance with some embodiments. FIG. 1I also shows an optional tape 122 that may be applied over the DAF 102 after the carrier wafer 100 is removed. The optional tape 122 may comprise a marking tape that is adapted to be marked with laser marking in some embodiments. In other embodiments, the DAF 102 may comprise a material that is adapted to be marked, e.g., with a laser, and the tape 122 may not be included in the structure. After the formation of the solder balls 110, testing may be performed on the die 104, and the tape 122 or DAF 102 may be marked to indicate results of the tests, for example. The packaged dies 104 may also be marked before or after singulation for a variety of other reasons.

FIG. 1I also shows a more detailed view of the die 104 and the wiring layer 108, in accordance with some embodiments. The view of the die 104 and wiring layer 108 are exemplary; alternatively, the die 104 and wiring layer 108 may comprise other configurations, layouts and/or designs. In the embodiment shown, the die 104 includes a substrate 124 comprising silicon or other semiconductive materials. Insulating layers 126a and 126b may comprise passivation layers disposed on the substrate 124. Contact pads 128 of the die 104 may be formed over conductive features of the substrate such as metal pads 127, plugs, vias, or conductive lines to make electrical contact with electrical components of the substrate 124, which are not shown. The contact pads 128 may be formed in an insulating layer 126c that may comprise a polymer layer or other insulating materials.

The wiring layer 108 may include insulating layers 132a and 132b that comprise polymers or other insulating materials. An RDL 130 may be formed within the insulating layers 132a and 132b, as shown, with portions of the RDL 130 making electrical contact with contact pads 128 on the die 104. An optional under bump metallization (UBM) structure (or layer) 134 may be formed on portions of the RDL 130 and insulating layer 132b, as shown. The UBM structure 134 facilitates in the connections and formation of the solder balls 110, for example. Further details of the method of packaging the semiconductor device are described in U.S. patent application Ser. No. 13/228,244, entitled "Packaging Methods and Structures Using a Die Attach Film" and filed on Sep. 8, 2011, which is incorporated herein in its entirety.

Figure 2A:
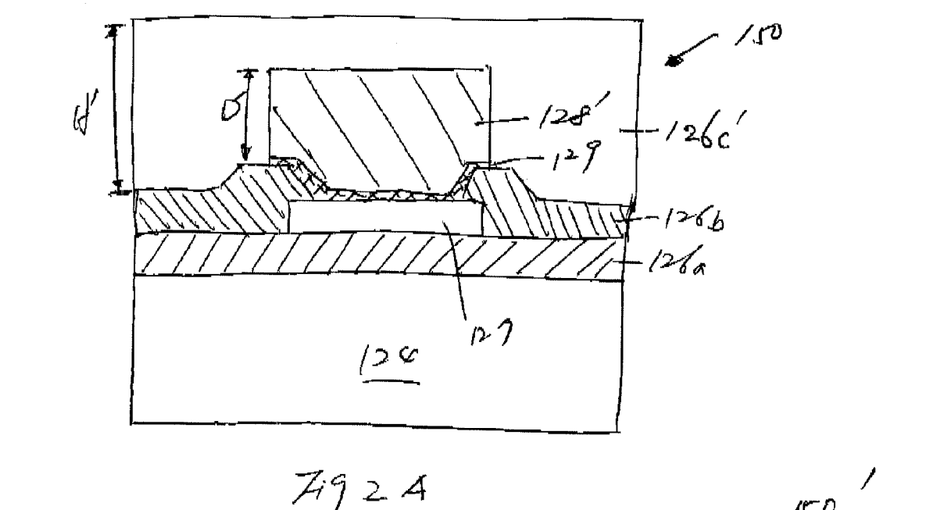
FIGS. 2A-2C are enlarged cross-sectional views of a portion of a semiconductor device in a fan-out wafer level package (FO-WLP) depicted in FIGS. 1B, 1C, and 1D respectively, in accordance with some embodiments.

FIG. 2A is an enlarged view of region 150 of FIG. 1B, in accordance with some embodiments. Region 150 is a portion of die 104 and includes substrate 124 as depicted in FIG. 1I. As mentioned above, there are devices in substrate 124, which comprises silicon and/or other semiconductive materials. Over substrate 124, there are insulating layers 126a, which insulate and separate conductive structures (not shown). Insulating layers 126a may include undoped silicon oxide, low-dielectric-constant (low-K) dielectric, doped dielectric films, or combinations thereof. The dielectric constant of the low-k dielectric may be less than 3.5, in some embodiments. The dielectric constant of the low-k dielectric may be less than 2.5, in some other embodiments.

FIG. 2A shows that regions 150 also include a metal pad 127, which may be made of aluminum or other applicable materials. Metal pad 127 is connected to devices on substrate 124 through an interconnect structure (not shown). A contact pad 128' is formed on metal pad 127. In some embodiments, contact pad 128' is made of copper and is formed over the metal pad 127 with an UBM layer 129, which is not shown in FIG. 1I for simplicity. The UBM layer 129 may include a copper diffusion barrier, which may be a titanium layer, a titanium nitride layer, a tantalum layer, or a tantalum nitride layer. UBM layer 129 may further include a seed layer, which may include copper or copper alloys. However, other metals, such as silver, gold, aluminum, and combinations thereof, may also be included.

In some embodiments, the contact pad 128' is a copper post and is formed by plating. An insulating layer 126b is used to insulate a portion of contact pad 128' and UBM layer 129 from the metal pad 127. The insulating layer 126b may be made of one or more dielectric layers, which may include oxide, nitride, polyimide, insulting polymers, or other applicable materials. An insulating layer 126c' covers the insulating layer 126b and the contact pad 128'. As mentioned above, insulating layer 126c' may comprise a polymer layer or other insulating materials. Exemplary polymer materials that can be used for insulating layer 126c may include epoxy, polyimide, benzocyclobutene (BCB), polybenzoxazole (PBO), and the like, although other relatively soft, often organic, dielectric materials can also be used.

In some embodiment, the height D' of the contact pad 128, measured above insulating layer 126b, is in a range from about 1 μm to about 25 μm. The height H' of the insulating layer 126c', measured above insulating layer 126b, is in range from about 1 μm to about 30 μm.

Figure 2B:
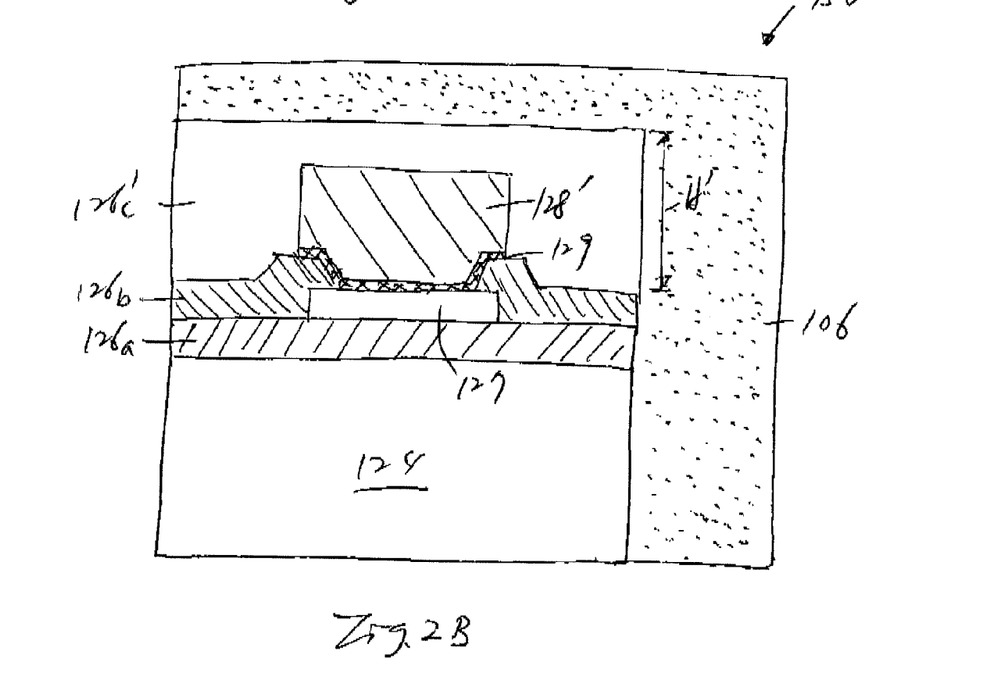

FIG. 2B is an enlarged view of region 150' of FIG. 1C, in accordance with some embodiments. FIG. 2B shows that a molding compound 106 covers die 104. As described and shown above in FIG. 1I, portions of the fan-out structures, such as RDL 130, would be built over molding compound 106. Molding compound 106 is initially in liquid form and is dried after being dispensed on the carrier wafer 100, in accordance with some embodiments. For example, the molding compound 106 may include epoxy, resin, silica filler or other additives.

Figure 2C:
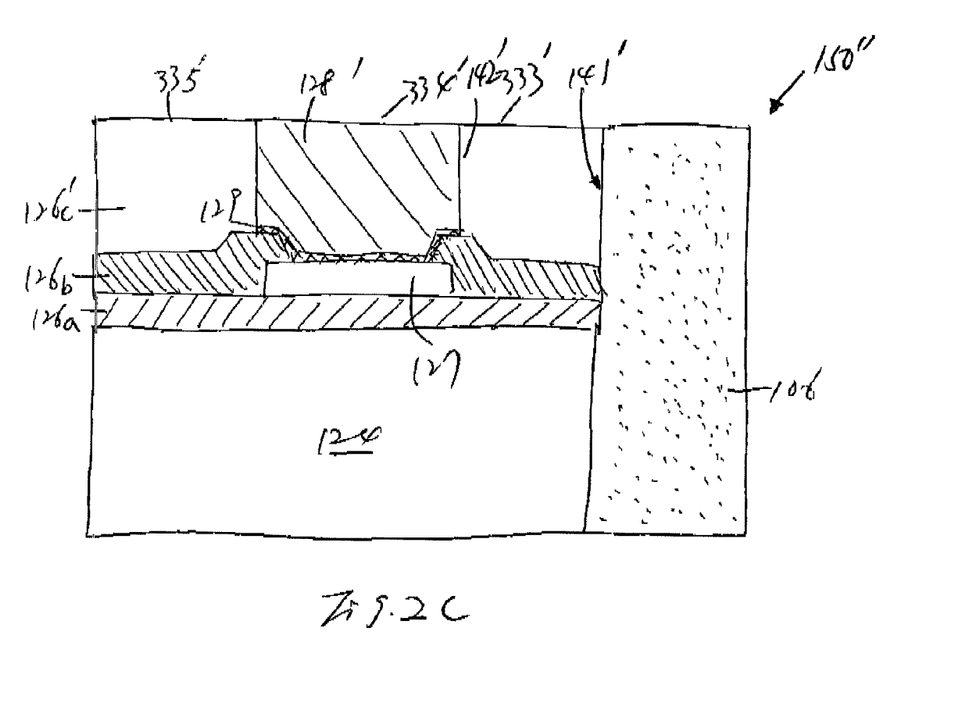

FIG. 2C is an enlarged view of region 150" of FIG. 1D, in accordance with some embodiments. FIG. 2C shows that portions of molding compound 106 and insulating layer 126c, and also possibly a portion of contact pad 128 have been removed by a planarization process, such as grinding, to remove excess materials from the surface of contact pad 128' and to planarize the substrate surface of FIG. 2B. Afterwards, the unfinished package (with structure of FIG. 2C on carrier wafer 100) is then sent on to undergo additional packaging processes described above in FIGS. 1E-1H to produce the packaged substrate, as shown in FIG. 1I in accordance with some embodiments. The interface 142' is between contact pad 128' and dielectric layer 126c'.

The following processing operations on the unfinished package (with structure of FIG. 2C on carrier wafer 100) including the mounting of the ball 110 could exert large stress on the packaged die 120. The interface 141' between insulating 126c' and molding compound 106 is linear, or vertical as shown in FIG. 2C. The linear interface 141' is relatively weak and could result in delamination under stress in some embodiments. In addition, when a planarization operation is applied on the substrate of FIG. 2B to remove portions of molding compound 106 and insulating layer 126c', and possibly a portion of contact pad 128', the determination of an endpoint of the planarization process could be challenging. The endpoint of the planarization process can be determined by detecting different torque forces experienced by the planarizing tool, such as a grinder, when the material being removed changes from molding compound 106 to insulating layer 126c' and then to contact pad 128'. In some embodiments, the endpoint is determined by the detection of contact pad 128' by the planarizing tool. It is challenging to determine the endpoint of the planarization process when the planarizing tool needs to identify the engagement with two different types of surfaces (insulating layer 126c' and contact pad 128').

In addition to the problems described above, the exposed surface 333' of the insulating layer 126c' could release chemicals during the formation of insulating layer 132a and RDL 130 in subsequent processing. As mentioned above, the insulating layer 126c' may be made of a polymer, which may decompose under plasma process, sputtering process, or photoresist ashing. The released chemicals from insulating layer 126c' could re-deposit on the interface 334' between contact pad 128' and RDL 130 and cause increased interfacial resistance. Due to at least these issues, there is a need to improve the mechanisms of forming the molding structure shown in FIGS. 2A-2C and their subsequent structures that lead to a packaged semiconductor device in accordance with some embodiments.

Figure 3A:
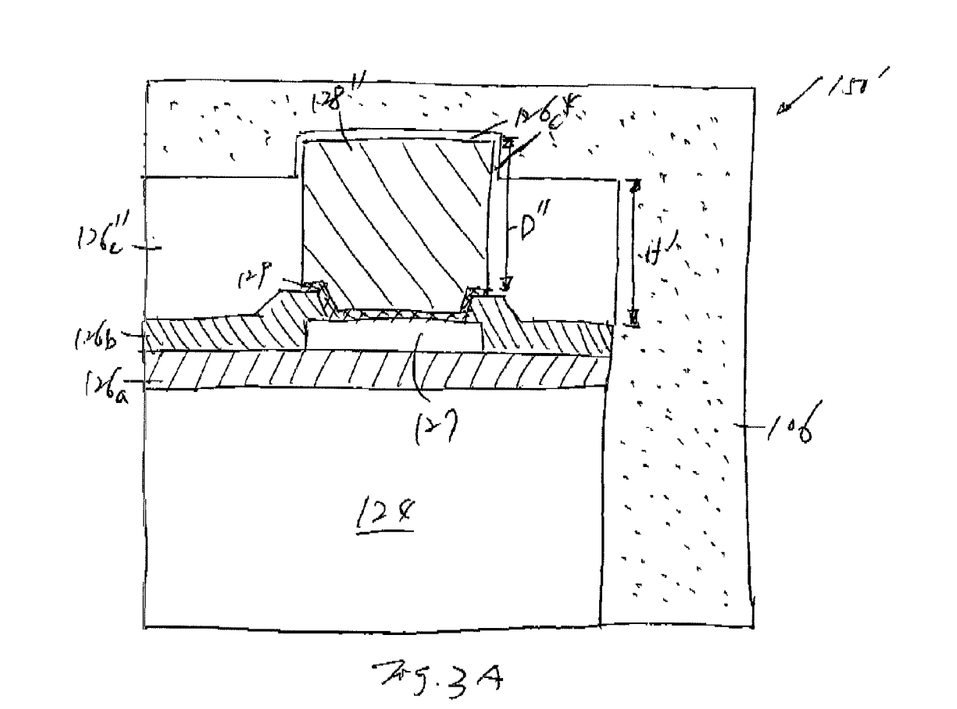
FIGS. 3A-3B are cross-sectional views of sequential processing of a semiconductor device in a fan-out wafer level package (FO-WLP) at various packaging stages in accordance with some embodiments.

FIG. 3A shows a more detailed cross-sectional view of region 150' of FIG. 1C, in accordance with some embodiments. The height D" of the contact pad 128" of FIG. 3A is higher than the height D' in FIG. 2A. In some embodiments, the height D" is in a range from about 1 μm to about 35 μm. The height H" of the insulating layer 126c", is in range from about 1 μm to about 30 μm. The surface 145 of the insulating layer 126c" is lower than the surface 434 of contact pad 128". If the insulating layer 126c" is formed by dispensing (such as by a spin-on process) a liquid containing polymers or precursors of polymers, a thin layer 126c* of the insulating layer 126c" is formed over the contact pad 128". In some embodiments, the thickness of the thin layer 126c* is in a range from about 0.01 μm to about 3 μm. Exemplary polymer materials suitable for forming the insulating layer 126c" have been described above. In some embodiments, there is a curing process afterwards to drive out the moisture or solvent in the film. FIG. 3A shows that a molding compound 106 covers die 104 with the insulating layer 126c".

Figure 3B:
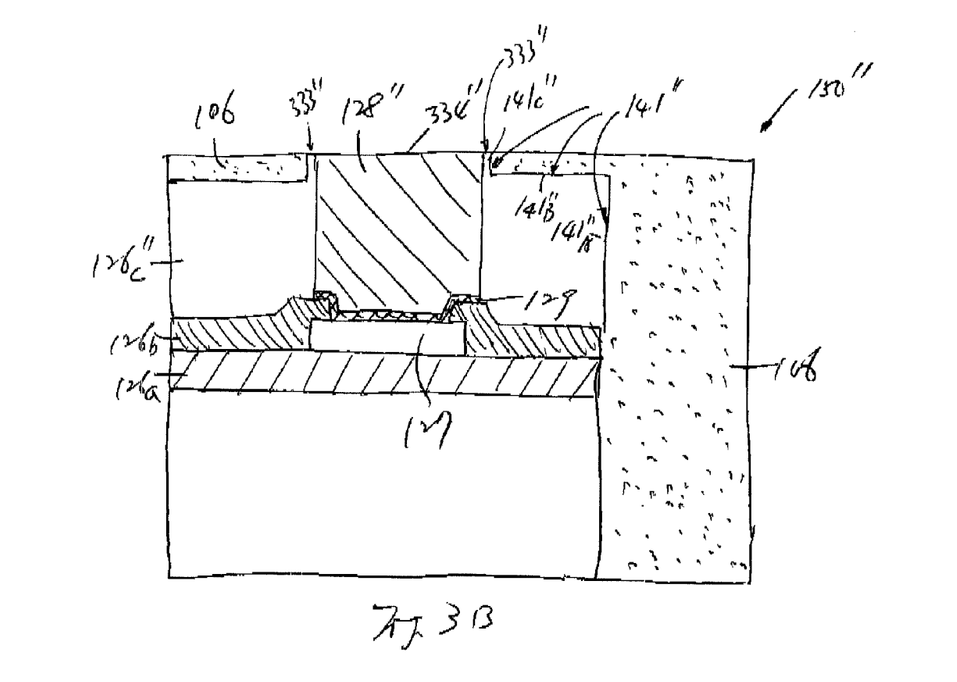
Figure 3C:
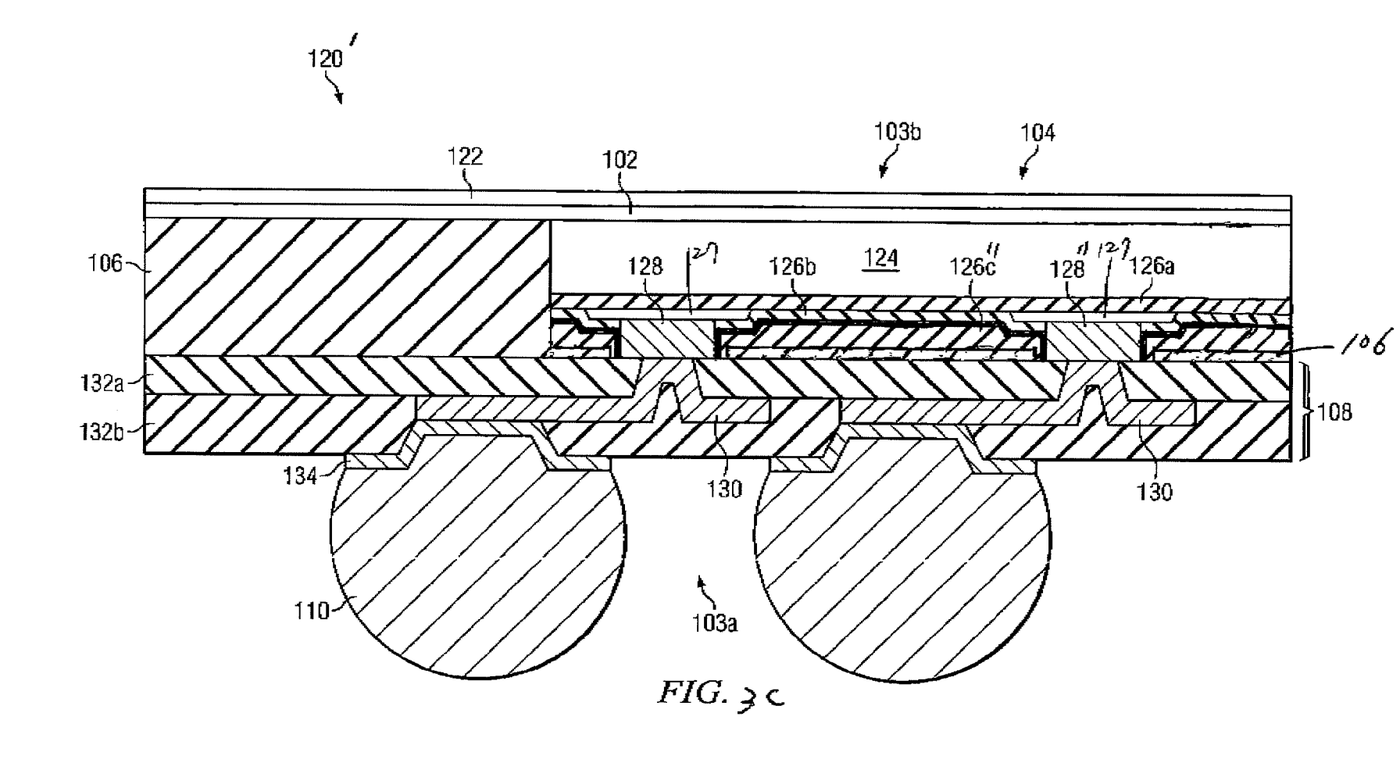
FIG. 3C is an enlarged, cross-sectional view of a packaged semiconductor device, in accordance with some embodiments.

FIG. 3B is an enlarged view of region 150" of FIG. 1D, in accordance with some embodiments. FIG. 3B shows that portions of molding compound 106, dielectric layer 126c" above contact pad 128" and also contact pad 128" have been removed and planarized, such as by grinding. The unfinished substrate package is then sent on to undergo additional packaging processes, such as those described above in FIGS. 1E-1H, to produce the packaged semiconductor devices in accordance with some embodiments. FIG. 3C shows a more detailed cross-sectional view of the packaged semiconductor device 120', in accordance with some embodiments.

With the structure shown in FIG. 3B, the interface 141" between the molding compound 106 and dielectric layer 126c" is not a single linear interface. Instead, the interface 141" has three sections of linear surfaces 141A", 141B", and 141C", connected to each other, as shown in FIG. 3C, in accordance with some embodiments. Interface(s) 141" is mechanically stronger than the single and linear interface 141' described above and can withstand more stress without delamination. In addition, during the planarization process to remove the portions of molding compound 106 and the dielectric layer 126c*, and possibly a portion of contact pad 128", there is only a thin layer of dielectric layer 126c* over the contact pad 128". This makes the determination of the endpoint of the planarization easier and more accurate, compared with processing a structure without the thin layer of dielectric layer 126c* over the contact pad 128". Because, once the torque force changes due to planarizing tool contacting dielectric layer 126c*, the planarizing tool would soon come in contact with the contact pad 128". The determination of the endpoint would be more precise. For example, a fixed time after torque force change can be set to stop the planarization process. In addition, the risk of higher interfacial resistance on the interface 334" of contact pad 128" has been greatly reduced. This is because the exposed surface 333" of the dielectric layer 126c" is greatly reduced (compared to surface 333' described above in FIG. 2B). Therefore, the amount of released chemicals of the dielectric layer 126c" is also greatly reduced. Thus the risk of re-deposition of the released chemicals of the dielectric layer 126c" on interface 334" is minimized.

Figure 4A:
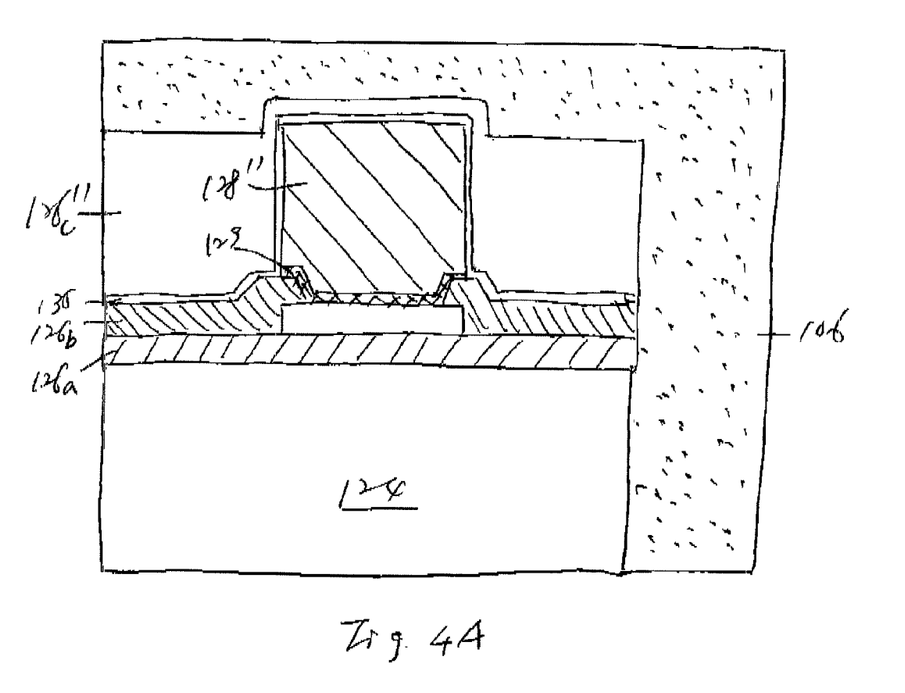
FIGS. 4A-4B are cross-sectional views of a semiconductor device in a fan-out wafer level package (FO-WLP) at various packaging stages in accordance with some embodiments.

For some packages, there are concerns of delamination at the interface 142' (see FIG. 2C) between the contact pad 128' and the dielectric layer 126c', as shown in FIG. 2C. Further, there could be concern of metal diffusion of contact pads 128', 128" for some packages if the contact pads 128', 128" include copper. As a result, a protective layer 135 could be deposited to surround the contact pad 128, as shown in FIG. 4A in accordance with some embodiments. The protective layer 135 may be made of a dielectric material, which includes SiN, SiC, SiCN, SiCO, TEOS, SiO$_2$, a low-k dielectric, etc. For example, the low-k dielectric can have a dielectric constant value less than about 3.5. The protective layer 135 also improves the adhesion between the dielectric layer 126c" and the contact pad 128". The thickness of the protective layer 135 is in range from about 50 nm to about 2 μm, in some embodiments. The processes of forming dielectric layer 126c" and molding compound 106 are similar to the processes described above in FIGS. 3A and 3B, in accordance with some embodiments. Afterwards, the portions of molding compound 106, dielectric layer 126c" and protective layer 135 over the contact pad 128" are removed.

Figure 4B:
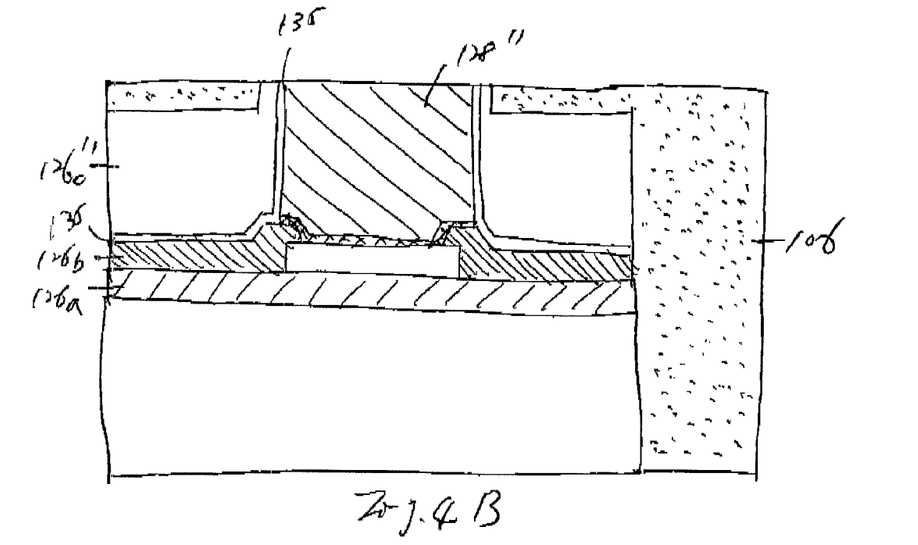
Figure 4C:
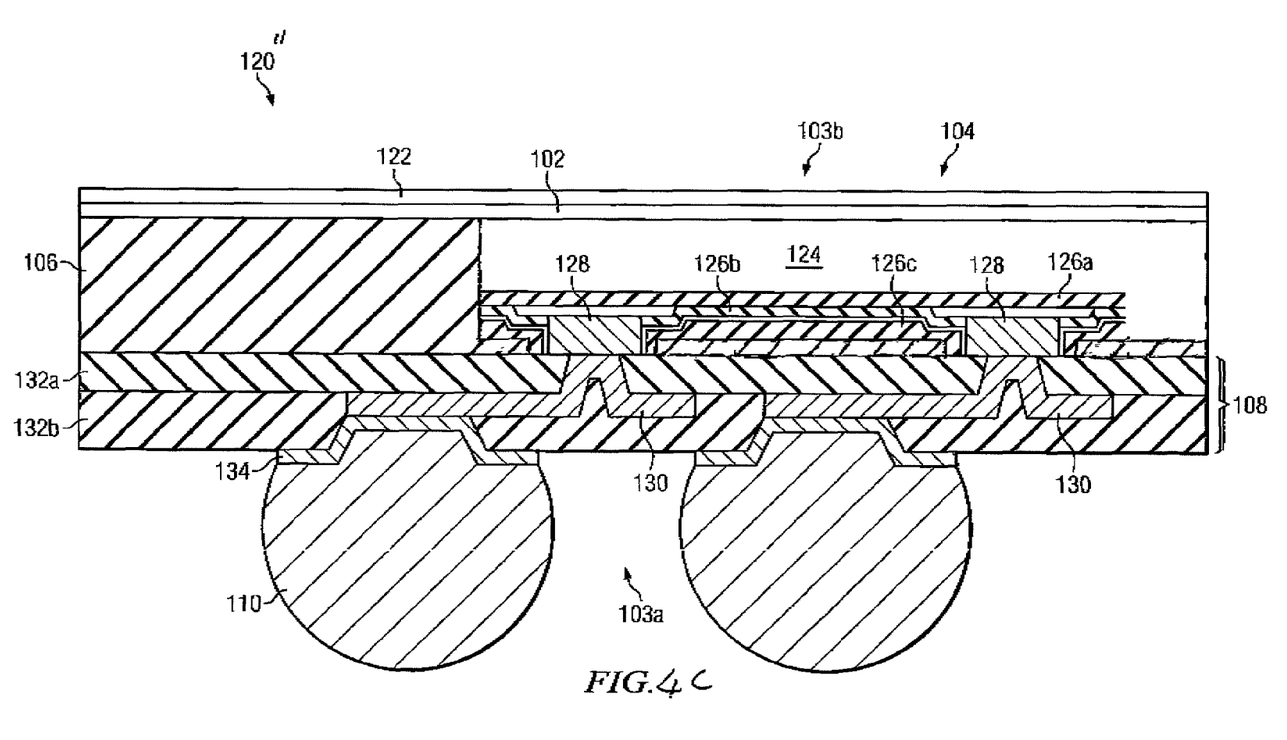
FIG. 4C is an enlarged, cross-sectional view of a packaged semiconductor device, in accordance with some embodiments.

FIG. 4B shows a cross-sectional view of the structure after planarization to remove materials over the contact pad 128", in accordance with some embodiments. The protective layer 135 covers the sidewalls of contact pad 128" and reduces the out-diffusion of copper in contact pad 128". In addition, the protective layer 135 also improves the adhesion between the contact pad 128" and dielectric layer 126c". FIG. 4C shows a cross-sectional view of the packaged semiconductor device 120", in accordance with some embodiments.

Figure 5A:
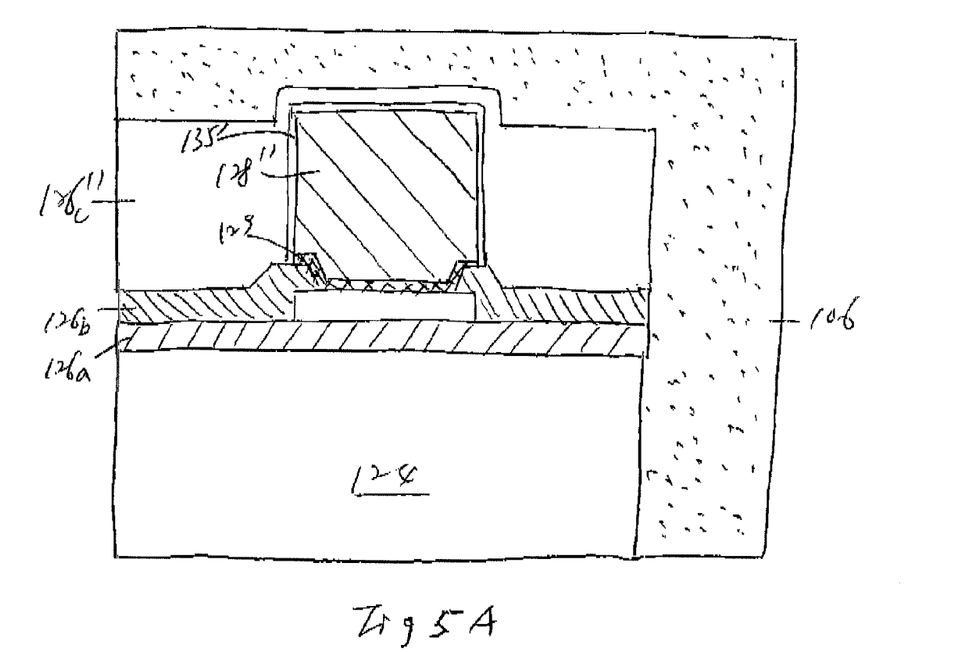
FIGS. 5A-5B are cross-sectional views of a semiconductor device in a fan-out wafer level package (FO-WLP) at various is an enlarged, stages in accordance with some embodiments.
Figure 5B:
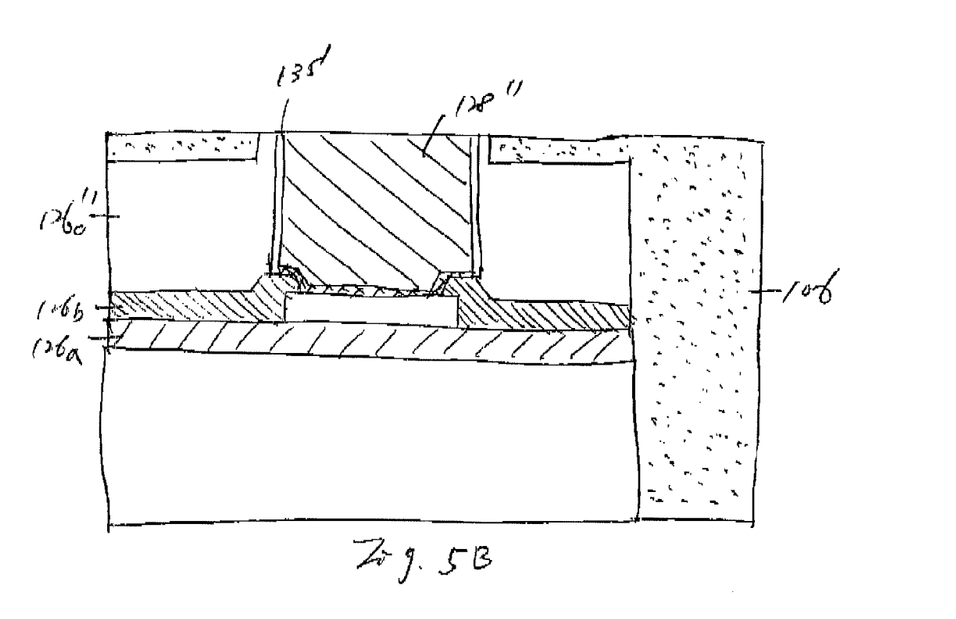
Figure 7:
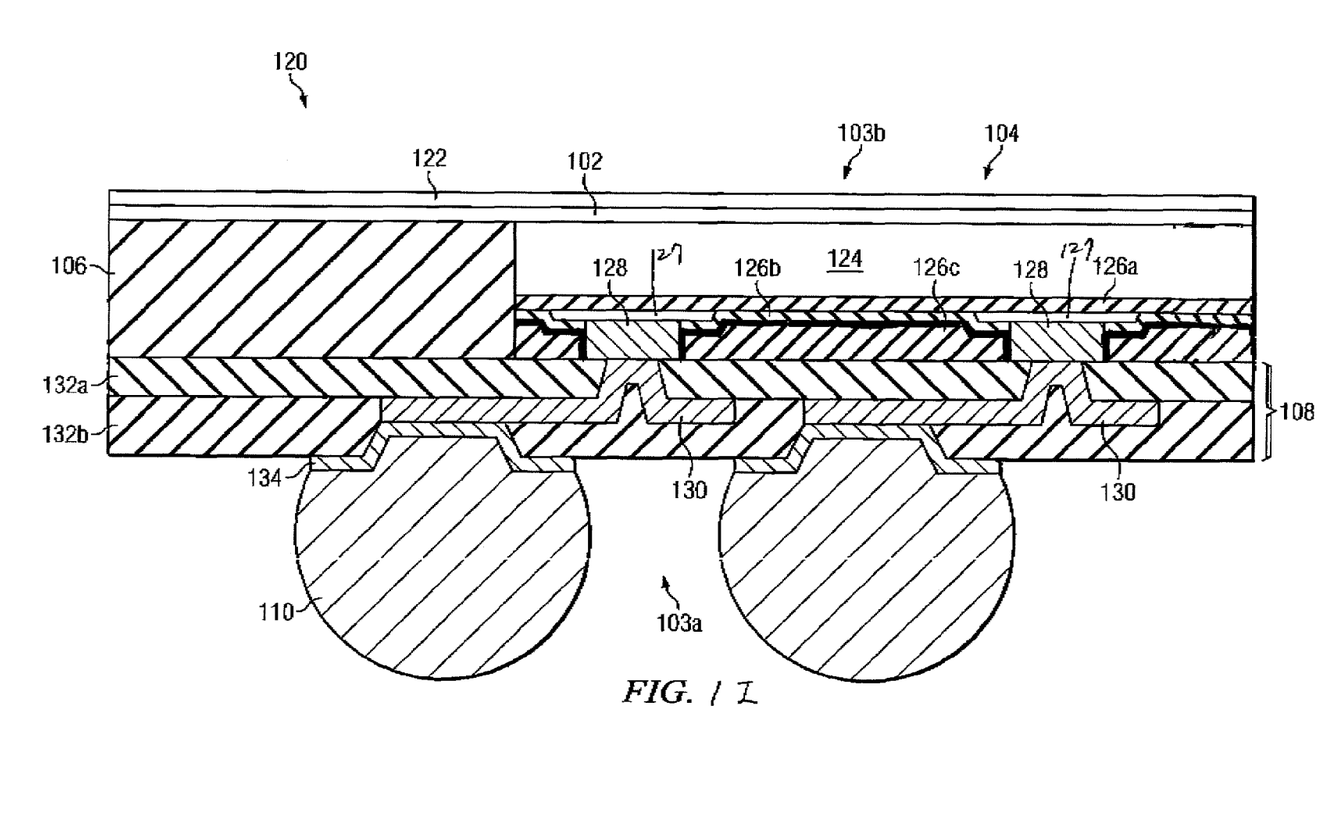

In some embodiments, the protective layer 135' may be made of a conductive material that is sufficient to prevent copper diffusion, such as Ta, TaN, Ti, TiN, Co, Mn, or combinations thereof. FIG. 5A shows protective layer 135' covering the sidewalls of contact pad 128" on substrate 124, in accordance of some embodiments. Protective layer 135' does not cover the surface of dielectric layer 126b. The protective layer 135' over the surface of dielectric layer 126b is removed by etching prior to the formation of dielectric layer 126c". In some embodiments, the etching process is a dry plasma process. Afterwards, the molding compound 106 is deposited on the substrate. The portions molding compound 106, the dielectric layer 126c*, protective layer 135' over the contact pad 128" are then removed by planarization. FIG. 5B shows a cross-sectional view of FIG. 5A after the planarization operation, in accordance with some embodiments.

The mechanisms of forming a molding compound on a semiconductor device substrate to enable fan-out structures in wafer-level packaging (WLP) are provided. The mechanisms involve covering portions of surfaces of an insulating layer surrounding a contact pad. The mechanisms improve reliability of the package and process control of the packaging process. The mechanisms also reduce the risk of interfacial delamination, and excessive outgassing of the insulating layer during subsequent processing. The mechanisms further improve the determination of the planarization end-point. By utilizing a protective layer between the contact pad and the insulating layer, copper out-diffusion can be reduced and the adhesion between the contact pad and the insulating layer may also be improved.

In some embodiments, a packaged semiconductor device is provided. The packaged semiconductor device includes a contact pad on a semiconductor die, and an insulating layer surrounding the contact pad. The packaged semiconductor device also includes a molding compound surrounding the insulating layer, and the molding compound comes in contact with two adjacent and non-linear surfaces of the insulating layer.

In some other embodiments, a packaged semiconductor device is provided. The packaged semiconductor device includes a contact pad on a semiconductor die, and an insulating layer surrounding the contact pad. The packaged semiconductor device also includes a protective layer, and the protective layer is between the contact pad and the insulating layer. The package semiconductor device further includes a molding compound surrounding the insulating layer, and the molding compound comes in contact with two adjacent and non-linear surfaces of the insulating layer.

In yet some other embodiments, a method of packaging a semiconductor device is provided. The method includes providing the semiconductor device, and the semiconductor device has a contact pad. The method also includes forming an insulating layer over the semiconductor device, and a thickness of the contact pad is greater than a thickness of the insulating layer. The method further includes forming a molding compound to cover the semiconductor device and a space between the semiconductor device and a neighboring semiconductor device. Both semiconductor devices are on a carrier wafer. In addition, the method includes planarizing a surface of the semiconductor device by removing the molding compound and the insulating layer over the contact pad.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaged semiconductor device, comprising:
a contact pad on a semiconductor die;
an insulating layer surrounding the contact pad, wherein the insulating layer surrounding the contact pad has a thin portion and a thick portion;
a molding compound surrounding the insulating layer, wherein the molding compound comes in contact with two adjacent and non-linear surfaces of the insulating layer, and a top surface of the molding compound is co-planar with a top surface of the thick portion of the insulating layer; and a wiring layer electrically connected to the contact pad, wherein the wiring layer extends beyond a boundary of the semiconductor die.

2. The package semiconductor device of claim 1, wherein the wiring layer is disposed on and physically connects to the contact pad.

3. The package semiconductor device of claim 1, wherein the thin portion has a thickness in a range from about 1 μm to about 30 μm.

4. The package semiconductor device of claim 1, wherein a protective layer is between the contact pad and the insulating layer.

5. The package semiconductor device of claim 4, wherein the protective layer is a copper diffusion barrier.

6. The package semiconductor device of claim 4, wherein the protective layer has a thickness in a range from about 50 μm to about 2 μm.

7. The package semiconductor device of claim 4, wherein the protective layer is also between the insulating layer and another insulating layer underneath.

8. The package semiconductor device of claim 4, wherein the protective layer is a dielectric material and includes a material selected from a group consisting of SiN, SiC, SiCN, SiCO, TEOS, $SiO_2$, or a low-k dielectric.

9. The package semiconductor device of claim 8, wherein the dielectric material also improves adhesion between the contact pad and the insulating layer.

10. The package semiconductor device of claim 4, wherein the protective layer is a conductive material and is made of a material selected from a group consisting of Ta, TaN, Ti, TiN, Co, and Mn.

11. The package semiconductor device of claim 1, wherein the contact pad is a copper post and has an under bump metallization layer underneath.

12. The packages semiconductor device of claim 1, wherein a thickness of the contact pad is greater than a thickness of the insulating layer.

13. A packaged semiconductor device, comprising:
a contact pad on a semiconductor die;
an insulating layer surrounding sidewalls of the contact pad;
a protective layer, wherein the protective layer is between the sidewalls of the contact pad and the insulating layer; and a molding compound surrounding the insulating layer, wherein the molding compound comes in contact with two adjacent and non-linear surfaces of the insulating layer, and the insulating layer separates the molding compound from an entirety of the semiconductor die.

14. A packaged semiconductor device, comprising:
a contact pad on a semiconductor die;
an insulating layer surrounding the contact pad; and
a molding compound surrounding the insulating layer, wherein the molding compound is separated from the contact pad, and the molding compound contacts a first surface of the insulating layer, a second surface of the insulating layer, and a third surface of the insulating layer, and the first surface is not parallel with the second surface, the third surface is substantially parallel to the first surface, and the second surface is between the third surface and the first surface.

15. The packaged semiconductor device of claim 14, further comprising a protective layer between sidewalls of the contact pad and the insulating layer.

16. The packaged semiconductor device of claim 15, further comprising a second insulating layer under the insulating layer, wherein the protective layer is between the insulating layer and the second insulating layer.

17. The packaged semiconductor device of claim 14, wherein a top surface of the contact pad is positioned farther from the semiconductor die than the second surface.

18. The packaged semiconductor device of claim 14, wherein a top surface of the molding compound is coplanar with a top surface of the contact pad.

19. The package semiconductor device of claim 14, wherein the insulating layer comprises:
a top portion positioned to separate the molding compound from the contact pad in a direction parallel to a top surface of the contact pad by a first distance; and
a lower portion positioned to separate the molding compound from the contact pad in the direction parallel to the top surface of the contact pad by a second distance, wherein the second distance is greater than the first distance.

20. The package semiconductor device of claim 14, wherein a top of the third surface is co-planar with a top surface of the molding compound.

* * * * *